US 6,716,722 B1

(12) United States Patent
Furihata et al.

(10) Patent No.: US 6,716,722 B1
(45) Date of Patent: Apr. 6, 2004

(54) METHOD OF PRODUCING A BONDED WAFER AND THE BONDED WAFER

(75) Inventors: Jun-ichiro Furihata, Annaka (JP); Kiyoshi Mitani, Annaka (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 259 days.

(21) Appl. No.: 09/787,038

(22) PCT Filed: Jul. 11, 2000

(86) PCT No.: PCT/JP00/04634

§ 371 (c)(1),
(2), (4) Date: Mar. 13, 2001

(87) PCT Pub. No.: WO01/06564

PCT Pub. Date: Jan. 25, 2001

(30) Foreign Application Priority Data

Jul. 15, 1999 (JP) .......................... 11-201585

(51) Int. Cl.[7] ............................... H01L 21/30
(52) U.S. Cl. ...................... 438/459; 438/455
(58) Field of Search ................ 438/455, 457, 438/459

(56) References Cited

U.S. PATENT DOCUMENTS 5,899,731 A * 5/1999 Kai et al. .................... 438/471
5,932,048 A * 8/1999 Furukawa et al. .......... 156/153
5,976,983 A * 11/1999 Miyazaki et al. ........... 438/692

FOREIGN PATENT DOCUMENTS

| JP | A 5-90545 | 4/1993 |
| JP | A 6-236867 | 8/1994 |
| JP | A 6-349795 | 12/1994 |
| JP | A 7-106297 | 4/1995 |
| JP | A 9-252100 | 9/1997 |
| JP | A 10-92777 | 4/1998 |
| JP | A 10-242087 | 9/1998 |
| JP | A 11-162953 | 6/1999 |

* cited by examiner

*Primary Examiner*—John F. Niebling
*Assistant Examiner*—Christopher Lattin
(74) *Attorney, Agent, or Firm*—Oliff & Berridge, PLC

(57) ABSTRACT

There is provided a method of producing a bonded wafer comprising bonding a bond wafer and a base wafer via an oxide film or directly and then reducing thickness of the bond wafer, characterized in that the base wafer is a wafer produced by processes comprising slicing a silicon single crystal ingot, and then subjected at least to chamfering, lapping, etching, mirror polishing and cleaning, and the etching process is conducted by subjecting the wafer to alkali etching, and then acid etching, and an etching amount in the alkali etching is larger than an etching amount in the acid etching, and a chamfered part of the base wafer is subjected to a mirror finishing process after the etching, and a bonded wafer produced by the method. There can be provided a base wafers for a bonded wafer having good flatness wherein generation of particles from a chamfered part or a back surface is reduced in high productivity, and a bonded wafer wherein very few particles are generated, having SOI layer or silicon active layer excellent in flatness and thickness uniformity and a method of producing it.

21 Claims, 4 Drawing Sheets

METHOD OF PRODUCING A BONDED WAFER AND THE BONDED WAFER

TECHNICAL FIELD

The present invention relates to a method of improving flatness of a base wafer and suppressing generation of particles in a process for producing the bonded wafer having SOI layer or a silicon active layer.

BACKGROUND ART

Recently, public attention has been especially drawn to so called SOI (silicon on insulator) structure having a silicon active layer on a silicon oxide film with electrical insulation property, since it has characteristics of high speed of device, low electricity consumption, high breakdown voltage, high resistance to environment. As a typical method for producing such a SOI wafer having SOI structure, there has been the bonding method.

The bonding method is a technique wherein two silicon wafers are bonded via a silicon oxide film. For example, as shown in Japanese patent publication No. 5-46086, an oxide film is formed on at least one of the wafers, and closely contacted each other without interposing impurities at a contacted surface, and subjected to heat treatment at a temperature of 200 to 1200° C. in order to increasing bonding strength. The bonded wafer whose bonding strength is increased by the heat treatment can be then subjected to a grinding and polishing process. Accordingly, the wafer on which a device is fabricated (bond wafer) can be subjected to grinding and polishing process reduce its thickness as desired, and thereby a SOI layer on which a device is formed can be formed.

The bonded SOI wafer produced as above is excellent in crystallinity of the SOI layer, and has an advantage of high reliability of buried oxide layer just under the SOI layer. However, the thickness thereof is reduced by grinding and polishing, which process takes long time for reducing thickness. Moreover, material is wasteful Furthermore, film thickness uniformity is generally in the range of ±0.5 $\mu$m of target thickness, which has been the largest technical subject of technology. As a method of reducing a film thickness for solving a problem of film thickness uniformity in the bonding method, there have been developed a so-called PACE (Plasma Assisted Chemical Etching) method disclosed in Japanese Patent publication No. 2565617, and a hydrogen ion delamination method (occasionally called smart-cut method) disclosed in Japanese Patent Application Laid-open (Kokai) No.5-211128.

PACE method is a method for making film thickness of SOI layer uniform according to vapor phase etching wherein SOI wafer produced by the bonding method (thickness of the SOI layer is several $\mu$m±0.5 $\mu$m) is prepared, distribution of thickness of the SOI layer to be uniform is measured to make a map of thickness distribution, thick part is removed by vapor phase etching (plasma etching) with control of value according to the map, so that the SOI layer with very thin and uniform thickness can be formed.

The hydrogen ion delamination method is a method wherein an oxide film is formed on at least one of two silicon wafers; at least one of hydrogen ions and rare gas ions is implanted into the upper surface of one of the wafers in order to form a fine bubble layer (enclosed layer) within the silicon wafer; the ion-implanted surface is brought into close contact with the other silicon wafer via the oxide film; heat treatment (delaminating heat treatment) is then performed to delaminate a portion of one of the wafers using the fine bubble layer as a cleavage plane (delaminating plane), in order to form a thin film; and heat treatment (bonding heat treatment) is further performed to firmly bond them, to provide an SOI wafer. Although the surface of the SOI wafer produced as above (a delaminated surface) is a relatively good mirror-like surface, it is subjected to a mirror polishing process, called "touch polishing", wherein a stock removal is very small, in order to provide SOI wafer having surface roughness equivalent to the general mirror polished wafer.

According to this method, an SOI wafer whose SOI layer has a very high thickness uniformity can be obtained relatively easily. Furthermore, the delaminated wafer can be reused, namely there is also an advantage that the material can be efficiently used.

Moreover, silicon wafers can be directly bonded without the oxide film, and it is possible to use the method not only for bonding silicon wafers each other, but also for bonding the ion-implanted silicon wafer to insulator wafer having different thermal expansion coefficient such as quartz, silicon carbide, alumina or the like.

As a result of development of these techniques for reducing film thickness, it has become possible to produce a bonded SOI wafer having SOI layer of very thin thickness of 0.1±0.01 $\mu$m and excellent thickness distribution. As a result, use of a bonded SOI wafer has been significantly broaden, and therefore it is expected to be applied to the most advanced device having very fine pattern or a special structure. Furthermore, a similar bonding method can also be applied to a wafer produced by directly bonding the silicon wafers without an oxide film.

In the bonding method, if surface roughness of two silicon wafers to be bonded each other is a mirror polished surface at general product grade, it is possible to produce the bonded wafer without generating bonding failure such as void or the like at bonding interface. Therefore, as a wafer to be used, mirror polished wafer (hereinafter occasionally referred to as PW) having general product grade has been used.

A method for producing PW comprises, as conventionally known, steps of slicing a silicon ingot, and a step of subjecting the resulting silicon wafer to, at least, chamfering, lapping, acid etching, mirror polishing of one surface and cleaning or the like. Depending on the purpose, the order of these steps can be partly changed, some of these steps can be repeated, or other steps such as a heat treatment step, a grinding step or the like can be added or changed thereto. Among these steps, the acid etching step is conducted in order to remove a surface degraded layer due to working of the surface introduced during mechanical machining such as slicing, chamfering, lapping or the like. It is conducted, for example, by etching with an acid mixture comprising hydrofluoric acid, nitric acid, acetic acid and water with an etching amount of several $\mu$m to several tens $\mu$m from the surface. Regarding this step, the following problems have been pointed out in the step.

1) Flatness of the lapped wafer having a deviation of thickness as expressed by TTV [Total Thickness Variation] ($\mu$m), $LTV_{max}$ [Local Thickness Variation] ($\mu$m) or the like is degraded more when the etching amount is more.

2) Waviness having a cycle in mm order or unevenness called peal is generated on the etched surface.

3) Harmful NOx is generated by etching.

Taking these problems into consideration, alkali etching is sometimes used.

Advantages and disadvantages of the alkali etching are explained below.

Advantages are as follows:

a) Flatness after lapping is maintained even after etching.
b) Generation of harmful gas is suppressed.

Disadvantages are as follows:

a) Pits having a depth of several μm and a size of several μm to several tens μm are present locally on the etched surface. Therefore, if impurities get into the pits, they may cause generation of particles and contamination in the following steps.
b) Since deep pits are present, and surface roughness (Ra) is increased, it is necessary to increase stock removal in the following mirror polishing step (mechanochemical polishing).
c) The shape of unevenness of the surface after alkali etching is sharp compared with acid etching treatment. Therefore, such unevenness itself may cause generation of particles.

Meanwhile, the most serious problem in the bonding method before the above-mentioned PACE method and the hydrogen ion delamination method have been developed was uniformity of the thickness of the SOI layer. As described above, since the bonding method comprises bonding a bond wafer to be made thin and a base wafer for supporting it directly or via an oxide film, and making the bond wafer thin by grinding and polishing it, it is very difficult to obtain uniform thickness of the film. Accordingly, it was necessary for obtaining uniform thickness of the film as possible, to improve flatness of the base wafer. Namely, when the bond wafer is ground or polished to be thin, it is conducted on the basis of the back surface of the base wafer. Accordingly, flatness of the base wafer directly affect uniformity of the film thickness of the SOI layer after the bond wafer is made thin.

For the above reason, PW wherein one surface of chemical etched wafer (hereinafter occasionally referred to as CW) produced by alkali etching method that is excellent in flatness was subjected to mirror polishing has been used for a base wafer of a bonded wafer.

According to the above-mentioned PACE method and hydrogen ion delamination method, thickness uniformity of a bonded wafer was significantly improved. However, PW for use as a base wafer can still be made only from CW with excellent flatness produced by alkali etching. The reason therefor is as follows.

As for PACE method, it was found that it is necessary to use a bonded SOI wafer having a thickness of about 5±0.5 μm and thickness uniformity produced by grinding and polishing, when a thin SOI wafer having a thickness of 0.1±0.01 μm is produced. Because, if thickness uniformity is worse than the above-mentioned value, it is not possible to obtain a sufficient effect of compensating deviation of thickness by one time PACE processing, and it is difficult to obtain target thickness and thickness uniformity. As a result, it is necessary to take a margin for work by making SOL layer thickness before PACE processing, and conduct PACE processing plural several times, which may lead to lower productivity and increasing cost.

On the other hand, as for hydrogen ion delamination method, deviation of thickness of SOI layer depends mainly on deviation of hydrogen ion implantation or oxide film thickness before hydrogen ion implantation. Accordingly, SOL layer having uniform distribution of film thickness can be formed regardless of flatness of the base wafer. However, the surface of the formed SOI layer becomes a transcription of the surface of the base wafer. Accordingly, if the base wafer having low flatness is used, deviation of film thickness of the SOI layer is good, but flatness of the surface of the SOI layer of the formed SOI wafer is bad. Accordingly, PW produced from CW with excellent flatness according to alkali etching method has been used as a base wafer also in a hydrogen ion delamination method.

However, with realization of thin film SOI wafer having a film thickness of 0.1±0.01 μm, it becomes necessary to apply to the most advanced device having very fine pattern or a special structure, and generation of particles becomes a main problem among the problems of alkali etching mentioned above. Furthermore, it was made clear that the particles are generated especially at a chamfered part of a base wafer of SOI wafer. The reason therefor is considered as follows. The chamfered part of the wafer is worked to be arched shape and surfaces of various orientation are exposed. Accordingly, if anisotropic etching such as alkali etching is conducted, difference in etching rate depending on the orientation becomes significant, so that uneven shape apt to generate fine particles are made.

As a method for suppressing generation of particles from a chamfered part, Japanese Patent Publication No.2588326 discloses a technique that a chamfered part is polished with a polishing cloth to be a mirror surface. However, this technique is proposed for application to a wafer subjected to acid etching. Accordingly, if it is simply applied to a wafer subjected to alkali etching that is used as a base wafer for SOI wafer, it takes much longer time to finish to be mirror surface, compared to the wafer subjected to acid etching, due to sharp and significant unevenness. Moreover, generation of particles from the back surface of a base wafer cannot be prevented.

DISCLOSURE OF THE INVENTION

The present invention has been accomplished to solve the above-mentioned problems. A main object of the present invention is to provide base wafers for a bonded wafer wherein generation of particles from a chamfered part or a back surface is reduced as possible without lowering flatness of the base wafer and in high productivity, and to provide a bonded wafer wherein very few particles are generated, having SOI layer or silicon active layer excellent in thickness uniformity.

To achieve the above mentioned object, the first method of the present invention provides a method of producing a bonded wafer comprising bonding a bond wafer made of silicon single crystal and a base wafer via an oxide film or directly and then reducing thickness of the bond wafer, wherein the base wafer is a wafer produced by processes comprising slicing a silicon single crystal ingot and then, subjected at least to chamfering, lapping, etching, mirror polishing and cleaning, and the etching process is conducted by subjecting the wafer to alkali etching, and then acid etching, and an etching amount in the alkali etching is larger than an etching amount in the acid etching.

As described above, if the etching process is conducted by subjecting the base wafer after lapping to alkali etching first to remove a damaged layer due to mechanical working with keeping flatness after lapping, and then subjecting it to acid etching, local deep pits remaining after alkali etching is made shallow, and surface roughness and sharp unevenness can be improved to be smooth. Thereby, unevenness itself can be prevented from causing generation of particles in the following mirror polishing process and polishing stock removal can be reduced.

In that case, an etching amount of alkali etching needs to be larger than an etching amount of acid etching. The main reason therefor is as follows. In order to make the local deep pits remaining after alkali etching shallow, an etching amount in alkali etching treatment needs to be larger than the etching amount in acid etching required for decreasing rate of generation of failure such as spot called stain due to unevenness of etching or flatness.

By bonding the bond wafer to the base wafer produced as described above and then reducing its thickness, it will be possible to produce a high quality bonded wafer having high flatness, excellent in thickness uniformity of SOI layer or silicon active layer and generates almost no particles.

In that case, it is preferable that a chamfered part of the base wafer is subjected to a mirror finishing process after the above-mentioned etching process.

As described above, since the chamfered part of the base wafer is apt to generate particles especially during alkali etching in the above-mentioned etching process, further smooth chamfered part from which particles are removed can be produced by conducting mirror finishing after the etching process. Furthermore, if mirror edge polishing is conducted after the above-mentioned two step etching process, polishing time can be significantly shorten compared to the conventional method wherein mirror edge polishing is conducted after alkali etching, and one to several $\mu$m of polishing stock removal is sufficient, and therefore productivity can be significantly improved. Accordingly, a base wafer for bonded wafer having high flatness and generating almost no particles can be produced at good yield. Thereby, productivity and cost performance can be improved.

According to the present invention, after bonding a bond wafer to a base wafer, a chamfered part of base wafer can be subjected to a mirror finishing process.

As described above, a chamfered part of base wafer can be subjected to a mirror finishing process after bonding a bond wafer to a base wafer, thereby particles apt to generate at a chamfered part can be removed, so that a bonded wafer having high quality can be produced.

Then, according to the present invention, it is preferable that an etching process is performed by dipping the wafer in an aqueous solution of hydrogen peroxide after conducting alkali etching, and then conducting acid etching.

The surface of the wafer after alkali etching is active, and hydrophobic, so that impurities are easily adhered thereon, namely apt to be contaminated. Thus, if the surface is made hydrophilic by immersing it in the aqueous solution of hydrogen peroxide to oxidize it, particles are hardly adhered thereon.

The above-mentioned etching amount is preferably 10 to 30 $\mu$m in the alkali etching and 5 to 20 $\mu$m in the acid etching.

Regarding alkali etching, as etching amount increases, a depth of local pits remaining after etching becomes shallow, and surface roughness tends to get worse on the contrary. Accordingly, the above-mentioned range is appropriate. Regarding acid etching, as etching amount increases, flatness gets worse, but a stain generation rate significantly decreases. Accordingly, the above-mentioned range is appropriate.

In the present invention, alkali etching solution can be an aqueous solution of NaOH or an aqueous solution of KOH, and the acid etching solution can be an aqueous solution of mixed acids comprising hydrofluoric acid, nitric acid, acetic acid and water.

Using such an etching solution, etching treatment in an alkali etching or an acid etching can be surely achieved, control of an etching amount is relatively easy, and cost therefor is low. All of the specific value of an etching amount shown in the present invention is total amount of an etching amount of both surfaces of the wafer.

The above-mentioned acid etching is preferably reaction-controlled acid etching.

If the acid etching is reaction-controlled as above, local deep pits remaining after alkali etching, surface roughness and unevenness can be improved, and furthermore, waviness can be improved to make the wafer flatter.

In that case, a solution for reaction-controlled acid etching can be an aqueous solution of mixed acids comprising hydrofluoric acid, nitric acid, acetic acid and water in which silicon is dissolved at concentration of 20 to 30 g/l.

Using such an etching solution, etching treatment can be surely achieved, control of an etching amount is relatively easy, and cost therefor is low.

The second method of the present invention also provides a method for producing a bonded wafer comprising bonding a bond wafer made of silicon single crystal and a base wafer via an oxide film or directly, and then reducing thickness of the bond wafer, wherein the base wafer is a wafer produced by processes comprising slicing a silicon single crystal ingot, and then subjected at least to chamfering, lapping, etching, mirror polishing and cleaning, and the etching process is conducted by subjecting the wafer to acid etching, and the mirror polishing process is conducted on both surfaces.

As described above, the etching process of the base wafer is conducted by acid etching, a degraded layer due to surface processing introduced during mechanical machining such as slicing, chamfering, lapping and the like, and to prevent generation of pits. If both of the surfaces thereof is then subjected to mirror polishing process, flatness can be surely improved, even though flatness is degraded by acid etching. As a result, improvement of flatness and reduction of particles can be realized at the same time. Accordingly, if the bond wafer is bonded to the base wafer, and then thickness is reduced, it will be possible to produce a high quality bonded wafer having high flatness, excellent in thickness uniformity of SOI layer or silicon active layer and having almost no particles.

In that case, it is preferable that a chamfered part of the base wafer is subjected to a mirror finishing process after the above-mentioned etching process.

As described above, if the chamfered part of the base wafer is subjected to mirror finishing after acid etching, time necessary for mirror edge polishing is scarcely increased, and no particles are generated from the chamfered part where particles are apt to be generated. Accordingly, it can be suitable as a base wafer for a bonded wafer.

A chamfered part can also be subjected to a mirror finishing process after bonding a bond wafer to a base wafer also in the second method of the present invention.

As described above, a chamfered part can also be subjected to a mirror finishing process after bonding a bond wafer to a base wafer, thereby generation of particles can be suppressed.

The present invention also provides a bonded wafer produced by the above-mentioned method.

As described above, in the first method or the second method of the present invention, a base wafer constituting a bonded wafer has high flatness is achieved and generation of particles is suppressed, and therefore thickness uniformity of SOI layer or silicon active layer of the bonded wafer obtained by bonding the bond wafer to the base wafer is more excellent, and therefore the wafer can be suitably used for fabrication of a device having extremely fine pattern or special structure.

Furthermore, the present invention also provides a bonded wafer having a base wafer wherein back surface is chemically etched, a chamfered part is mirror surface, and the chemically etched back surface of the base wafer is subjected to acid etching following to alkali etching.

The bonded wafer is, for example, produced by the first method of the present invention. Accordingly, almost no particles are generated from the back surface of the bonded wafer (back surface of the base wafer) and from a chamfered part of the base wafer. Flatness of the back surface of the bonded wafer is extremely high, and thickness uniformity of SOI layer or silicon active layer of the bonded wafer is extremely high.

The present invention also provides a bonded wafer wherein the back surface of its base wafer is chemically etched and a chamfered part is mirror surface, and on the chemically etched back surface, the maximal depth of the pit is 6 µm or less and the average value of waviness is 0.04 µm or less.

As described above, according to the present invention, it is possible to obtain a bonded wafer whose surface is extremely flat, and the depth of pit is shallow.

Furthermore, according to the present invention, a bonded wafer is also provided, wherein waviness having a wavelength of 10 mm is at least 0.5 to 10 µm$^3$ as power spectrum density.

As described above, according to the present invention, a bonded wafer wherein waviness on the back surface of the base wafer is in the above range can be obtained. Namely, the bonded wafer having quite excellent flatness can be obtained.

Additionally, the present invention also provides a bonded wafer wherein at least the back surface and the chamfered part of the base wafer are mirror surface.

As described above, since, in the present invention, the back surface of the base wafer constituting a bonded wafer is mirror surface, flatness is extremely high, and thickness uniformity of SOI layer or silicon active layer is excellent. Furthermore, since the back surface and the chamfered part are mirror surface, no particles are generated from the obtained bonded wafer.

As described above, according to the present invention, there can be produced a base wafer for a bonded wafer wherein flatness of the wafer after lapping can be maintained, waviness of the surface of the wafer after etching can be reduced, and generation of local deep pits and degradation of surface roughness can be suppressed, and contamination such as particles, stains or the like are rarely generated on the mirror chamfered part and the back surface. When the bond wafer is bonded to the base wafer and thickness thereof is reduced, thickness uniformity of SOI layer or silicon active layer of the bonded wafer is extremely excellent. Accordingly, it can be suitably used for fabrication of a device having fine pattern or special structure. Furthermore, almost no prolongation of time for mirror polishing of a chamfered part is necessary in order to make the surface smooth and suppress generation of particles. Accordingly, yield and productivity are improved and cost performance is also improved.

Curved line A shows a result as for the wafer of Example 1 subjected to both alkali etching and acid etching.

Curved line B shows a result as for the wafer of Comparative Example 1 subjected to only alkali etching.

Curved line C shows a result as for the wafer subjected to only acid etching.

BEST MODE FOR CARRYING OUT THE INVENTION

The embodiment of the present invention will be further described below with referring to the figures, but is not limited thereto.

The inventors have studied a base wafer wherein flatness after lapping can be maintained, and particles and contamination are hardly generated, when producing PW for a base wafer for producing a bonded wafer, and have thought out that alkali etching is conducted first in order to remove a distorted layer with maintaining flatness after lapping, then acid etching, especially reaction-controlled acid etching is conducted in order to improve deep pits remaining there, surface roughness or waviness, and subsequently mirror polishing of a chamfered part where particles are apt to be generated is conducted. Furthermore, they noted that a double-side polished wafer is excellent in flatness, and found that improvement of flatness and reduction of particle generation can be realized at the same time without increasing time for mirror edge polishing, if acid etching is conducted as etching before double-side polishing and a chamfered part is subjected to mirror polishing, and thereby completed the present invention.

Figure 1:
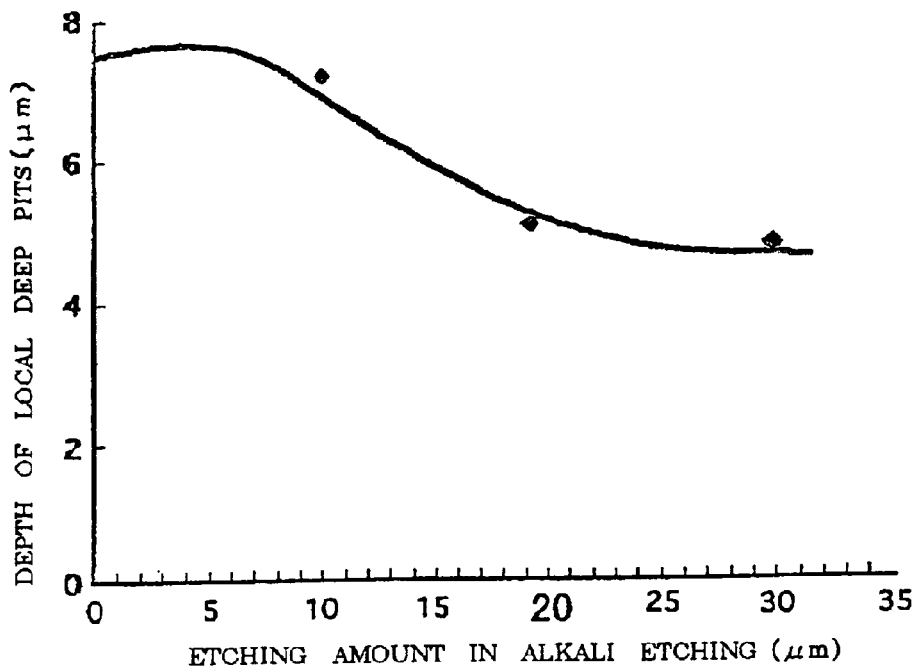
FIG. 1 is a graph showing a relation between an etching amount and a depth of local deep pit of a wafer subjected to alkali etching after lapping.
Figure 2:
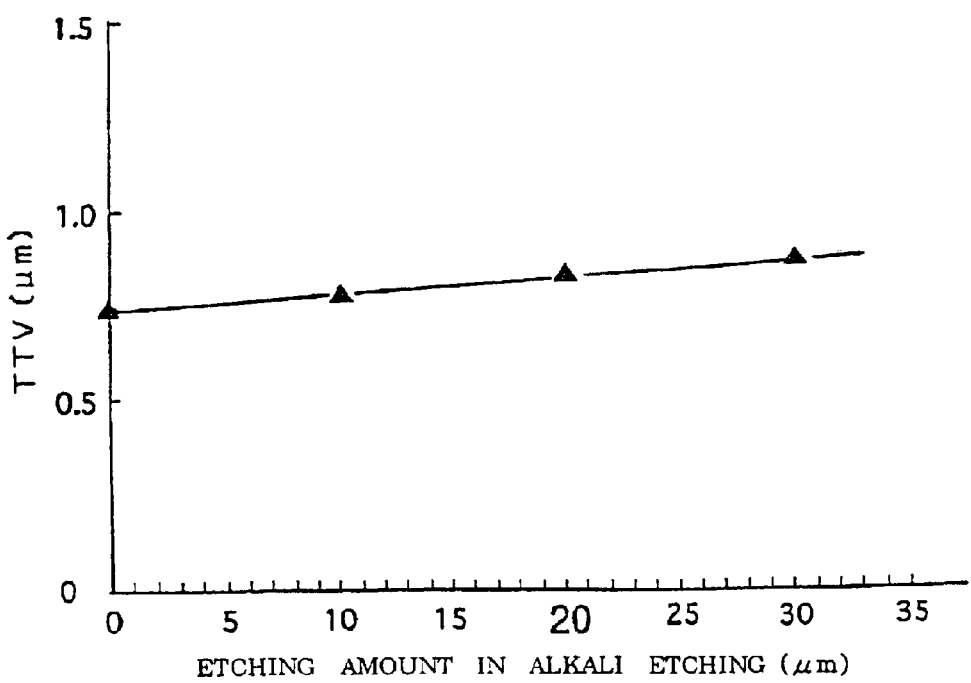
FIG. 2 is a graph showing a relation between an etching amount and TTV (flatness) of a wafer subjected to alkali etching after lapping.
Figure 3:
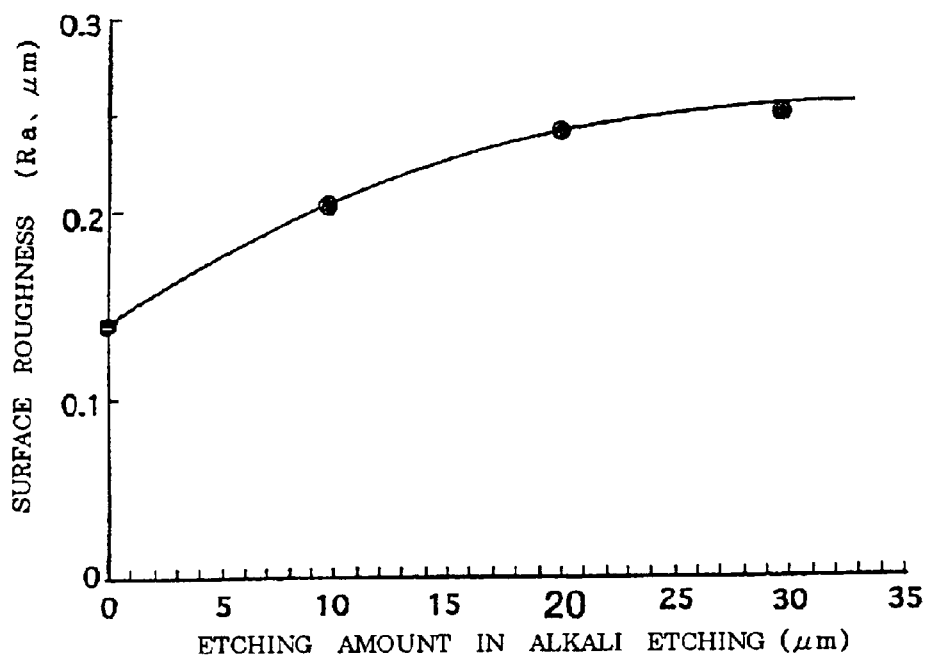
FIG. 3 is a graph showing a relation between an etching amount and surface roughness (Ra) of a wafer subjected to alkali etching after lapping.

First, alkali etching will be explained in detail. FIG. 1 shows a relation between an etching amount and a depth of local deep pit of a wafer having a diameter of 8 inches subjected to lapping with lapping abrasive grains #1200 and then to alkali etching at 85° C. with 50% aqueous solution of NaOH. FIG. 2 shows a relation between etching amount and TTV of the above-mentioned wafer. FIG. 3 shows a relation between etching amount and surface roughness (Ra).

The local deep pit means pit that is formed as a result of sticking of lapping abrasive grains on the surface of the wafer during lapping and is increased in size and depth due to alkali etching. If concentration of alkali is low, depth of pit tends to increase. If concentration of alkali is high, depth of pit can be shallow, but in that case, etching amount needs to be large, and therefore, efficiency is low. The depth of the pit is measured by the depth of focus of a optical microscope. In order to remove the pits, polishing is necessary in a mirror polishing process, which is the later process. Since stock removal of the mirror polishing needs to be the maximal value of the depth of such a deep pit or more, it is preferable to make pit shallow as. possible.

TTV [Total Thickness Vairation]($\mu$m) is a value of difference between thickness of the wafer at the thickest part and thickness of the wafer at the thinnest part in one wafer, and is an index of flatness of the wafer. LTV [Local Thickness Variation]($\mu$m) is a value of difference between thickness of the wafer at the thickest part and thickness of the wafer at the thinnest part in one of cells that are resulted by dividing a wafer into cells (generally each having a size of 20×20 mm or 25×25 mm). LTV of each cell is called $LTV_{cbc}$, the maximal value in one wafer is called $LTV_{max}$, which is an index of flatness of a wafer.

Ra($\mu$m) is center line average roughness, which is one of surface roughness parameters used most often.

In order to make a depth of local deep pit shallow, etching amount of 10 $\mu$m or more in alkali etching is necessary (FIG. 1). It is preferable to etch at etching amount of 30 $\mu$m or less in order to achieve TTV (FIG. 2) of 1 $\mu$m or less and Ra (FIG. 3) of 0.25 $\mu$m or less. Accordingly, considering all of the above-mentioned facts, a suitable range of etching amount in alkali etching is 10 to 30 $\mu$m. Etching amount of about 20 $\mu$m is especially preferable in order to obtain a wafer wherein depth of a local deep pit is close to the minimum value (about 5 $\mu$m), and TTV and Ra are not degraded so much.

Then, etching amount in acid etching was studied.

Figure 4:
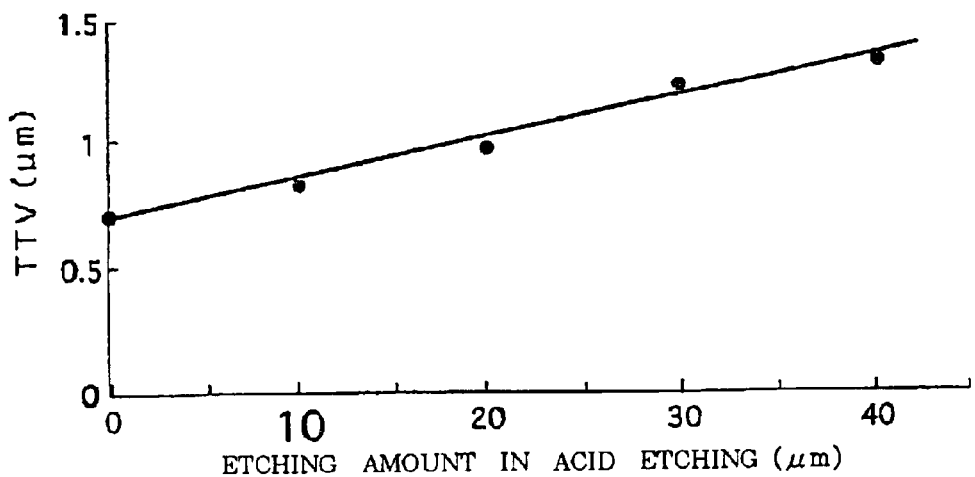
FIG. 4 is a graph showing a relation between an etching amount and TTV (flatness) of a wafer subject d to acid etching after lapping.

FIG. 4 shows a relation between an average value of an etching amount and TTV after etching of a wafer having a diameter of 8 inches subjected to lapping with lapping abrasive grains #1200 and then to etching with a mixed acid [50% hydrofluoric acid:70% nitric acid:99% acetic acid= 1:2:1 (by volume)].

Figure 5:
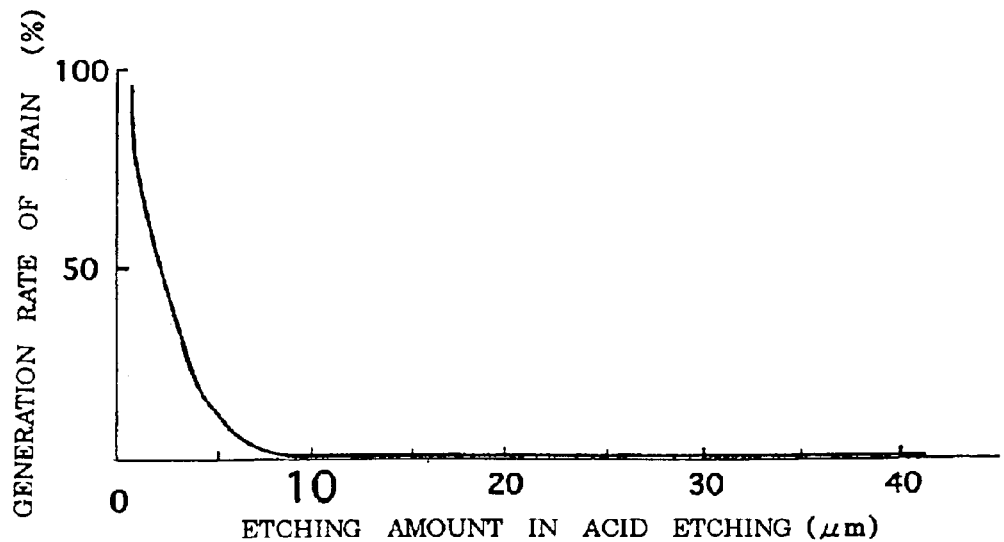
FIG. 5 is a graph showing a relation between an etching amount and a generation rate of stain of a wafer subjected to acid etching after lapping.

FIG. 5 shows a relation between an etching amount of a chemically etched wafer subjected to general acid etching and a generation rate of failure such as spot called stain due to unevenness of etching. Presence or absence of stain generation was determined by observing with naked eye under collimated light.

As shown in FIG. 5, in order to prevent generation of stain, an etching amount in acid etching needs to be at least 5 $\mu$m or more. In order to prevent generation of stain surely, an etching amount of 10 $\mu$m or more is necessary. On the other hand, as shown in FIG. 4, in order to achieve TTV of one $\mu$m or less, a suitable etching amount is 20 $\mu$m or less. Accordingly, considering all of the above-mentioned facts, a suitable range of an etching amount in acid etching is 5 to 20 $\mu$m, and about 10 $\mu$m is especially preferable.

The relation between etching amount in alkali etching and acid etching and effect of etching has been explained above separately. Considering the above results sufficiently, both alkali etching and acid etching are conducted in the method of the present invention. Furthermore, a method wherein alkali etching is first conducted, and then acid etching is conducted is successful in make use of characteristics of both etching sufficiently, namely etching can be fully effective (the first method of the present invention).

Namely, if both alkali etching and acid etching are conducted, first, a distorted layer due to mechanical working can be removed by alkali etching with maintaining flatness after lapping, and then by the acid etching local deep pits remaining after alkali etching and sharp unevenness on the surface can be removed to provide smooth surface, so that surface roughness can be improved, and furthermore, a rate of stain generation can be suppressed.

In that case, an etching amount in alkali etching needs to be larger than an etching amount in acid etching. The main reason therefor is as follows. In order to make a depth of local deep pits remaining after alkali etching shallow, the etching amount in alkali etching needs to be large, and it is larger than the etching amount in acid etching necessary to make a rate of stain generation and flatness small.

Thereby, the uneven shape at a chamfered part of a base wafer can be made smooth, so that efficiency of mirror polishing at a chamfered part can be improved. More specifically, if time necessary for mirror finishing at a chamfered part (mirror edge polishing) of a wafer subjected to general acid etching only is defined as 1, the time is 2 as for a wafer subjected to alkali etching only, and sometimes it was necessary to grind a chamfered part again before mirror edge polishing in that case. However, in the case of the above-mentioned alkali etching+acid etching, the above-mentioned time is 1.1 to 1.3. Although it is difficult to measure a polishing stock removal accurately, it was confirmed that mirror surface can be obtained with a polishing stock removal of about 1 $\mu$m to several $\mu$m. The mirror edge polishing may be conducted before bonding a base wafer to a bond wafer, or after producing a bonded wafer.

According to the present invention, it is preferable to conduct acid etching after conducting alkali etching and then dipping the wafer in an aqueous solution of hydrogen peroxide. Because, the surface of the wafer after alkali etching is active and hydrophobic, so that impurities are easily adhered thereon, namely the surface is apt to be contaminated. If the surface is made hydrophilic by immersing it in the aqueous solution of hydrogen peroxide to be oxidized, particles are hardly adhered thereon. Accordingly, an acid etching solution used in the next step is never contaminated with particles.

Preferable concentration of an aqueous solution of hydrogen peroxide is 0.1 to 30%. Because, the concentration less than 0.1% is insufficient to make the surface hydrophilic, and 30% is enough therefor, and higher concentration is economically disadvantageous.

Next, reaction-controlled acid etching will be explained.

A solution for reaction-controlled acid etching is an aqueous solution of mixed acids comprising hydrofluoric acid, nitric acid, acetic acid and water in which silicon is dissolved at concentration of 20 to 30 g/l. The solution has a relatively similar effect to that of an alkali etching solution.

The etching solution is called reaction-controlled acid etching. Because, it is acid of which an etching rate is determined depending on a reaction rate, whereas an etching rate is determined depending on a diffusion rate in the case of an aqueous solution of a mixed acid that is a general acid etching solution.

If the reaction-controlled acid etching is conducted after alkali etching, a distorted layer due to mechanical working is removed by alkali etching with maintaining flatness after lapping, and then by the reaction-controlled acid etching, local deep pits remaining after alkali etching and unevenness having a sharp shape on the surface can be removed to provide a smooth surface, and surface roughness is improved, and generation of stain can be suppressed. Furthermore, waviness is also suppressed more compared to diffusion-controlled acid etching, so that flatness can be further improved.

According to the two step chemical etching consisting of alkali etching and acid etching of the present invention described above, there can be easily and stabley produced a base wafer having flatness shown as $LTV_{max}$ of 0.3 $\mu$m or less at a cell size of 20×20 mm and a maximal value of pit depth on the back surface of 6 μm or less.

Furthermore, a base wafer can be processed to have an excellent flatness in a large area such that the average value of waviness on the back surface is 0.04 μm or less.

Furthermore, in such a base wafer, waviness component having a wavelength of 10 mm on the back surface is 0.5 to 10 μm$^3$ as a power spectrum density.

According to another embodiment of the present invention (the second method), only acid etching is conducted as etching of a base wafer, both surface of the etched wafer is polished with a double side polishing apparatus, and a chamfered part is subjected to mirror polishing. Namely, even when CW obtained by acid etching is used, a base wafer having excellent flatness can be obtained by conducting double side polishing. Furthermore, generation of particles from the back surface can be reduced, since the back surface (the opposite surface to the surface to which a bond wafer is bonded) is also mirror surface. Since unevenness at a chamfered part of the wafer is the same as that of CW obtained by general acid etching, mirror finishing of a chamfered part can also be easily conducted. When producing a bonded wafer using such a base wafer, there can be obtained a bonded wafer wherein a back surface and a chamfered part are mirror surface, flatness is excellent, and only few particles are generated.

Also in that case, mirror edge polishing may be conducted before bonding the base wafer to the bond wafer or after producing a bonded wafer.

The present invention will be specifically explained hereunder by the following example and the comparative example. The example is not intended to limit the scope of the present invention.

EXAMPLE 1

Using lapped wafer having a diameter of 200 mm (lapping abrasive grains No.: #1200), the following etching treatment was conducted. As lapped wafers, the wafers of which chamfered parts were ground with #1500 were used.

First, alkali etching was conducted with an target etching amount of 20 μm by immersing the wafer in 50% by weight aqueous solution of NaOH at 85° C. for 450 seconds. Then, treatment for allowing the surface hydrophilic was conducted by immersing the wafer in 0.3% aqueous solution of hydrogen peroxide, followed by acid etching with an target etching amount of 10 μm using a mixed acid wherein commercially available 50% hydrofluoric acid, 70% nitric acid, and 99% acetic acid were mixed at a volume rate of 1:2:1. Then, etching effect to the etched wafer (CW) was evaluated by measuring flatness, surface roughness, pit depth and waviness. The results were shown in Table 1.

Measurement of flatness (TTV, LTV) was conducted using Flatness measuring apparatus manufactured by ADE corporation (U/G9500, U/S9600), and measurement of surface roughness (Ra) was conducted by universal surface shape measuring device manufactured by Kosaka Laboratory, Ltd. (SE-3C type).

Figure 6:
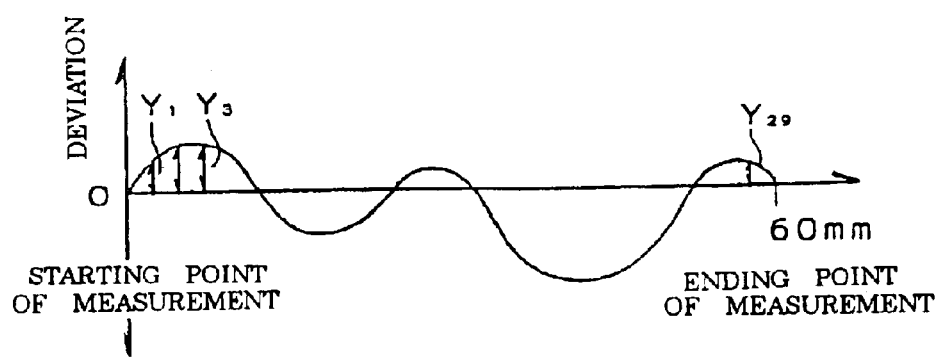
FIG. 6 is an explanatory view of definition of waviness on the surface of the wafer.

Measurement of waviness was conducted by universal surface shape measuring device manufactured by Kosaka Laboratory, Ltd. (SE-3F type). The method for measurement comprises tracing 60 mm at a center part on the surface of the wafer (having a diameter of 200 mm) with a probe, and only shape components excluding fine roughness components are measured. The waviness is determined as shown in FIG. 6. Namely, height at a point where measurement is begun and height at a point where measurement is stopped were equalized, and it is defined as an origin, variation was measured at an interval of 2 mm, and the average Y of the absolute value of the variation Y1 to Y29 was defined as waviness.

TABLE 1

| Item | TTV (μm) | LTV$_{max}$ (μm) | Ra (μm) | Pit Depth (μm) | Waviness (μm) |
|---|---|---|---|---|---|
| Example 1 | 0.96 | 0.53 | 0.18 | 5.2 | 0.060 |
| Example 2 | 0.60 | 0.29 | 0.22 | 5.5 | 0.033 |
| Comparative Example 1 | 0.90 | 0.38 | 0.24 | 8.8 | — |

After the measurement described above, a chamfered part of the CW was subjected to mirror finishing by polishing for 100 seconds per one wafer using a mirror edge polishing apparatus (manufactured by Speed Fam corporation). The surface opposite to the surface where surface roughness, pit depth, waviness were measured above was subjected to general mirror polishing to produce PW for a base wafer.

Then, there was prepared a bond wafer having a diameter of 200 mm wherein a thermal oxide film having a thickness of about 0.5 μm was formed on the surface, and the mirror surface thereof was bonded to the mirror surface of the above-mentioned base wafer, and then subjected to heat treatment at 1100° C. for 2 hours. The bond wafer was then subjected to grinding and polishing to produce a bonded SOI wafer having a thickness of 4±0.5 μm.

Furthermore, the SOI wafer was processed according to PACE method, until the thickness gets about 100 nm. standard deviation (σ) of SOI thickness distribution after PACE processing was about 3.2 nm. Accordingly, SOI wafer having sufficient thickness uniformity of 100±10 nm (0.1±0.01 μm) could be produced.

EXAMPLE 2

Using a lapped wafer of same specification as that used in Example 1, a base wafer was produced according to the same method as Example 1 except using a mixed acid in which silicon is previously dissolved at concentration of 27.5 g/l at acid etching after alkali etching, and was evaluated according to the same method. The results were shown in Table 1. The SOI wafer was also produced according to the same method as Example 1. Thickness of the resultant wafer was about 100 nm, and standard deviation (σ) of SOI thickness distribution was about 2.5 nm.

Comparative Example 1

CW was produced by conducting only alkali etching described in Example 1 (target etching amount of 20 μm) using a lapped wafer of same specification as Example 1, and was evaluated according to the same method. The results were shown in Table 1. A chamfered part of the CW wafer after measurement was subjected to mirror finishing by the same method as Example 1 using a mirror edge polishing apparatus. It took 200 seconds or more to obtain a mirror surface having the same level as Example 1.

EXAMPLE 3

CW was produced by conducting acid etching under the same condition as that of Example 1 with an etching amount of 20 μm using a lapped wafer of same specification as Example 1 without conducting alkali etching. A chamfered part was subjected to mirror finishing by the same method as Example 1 using a mirror edge polishing apparatus. It took about 90 seconds or more to obtain a mirror surface having the same level as Example 1. Then, a base wafer was produced by subjecting the CW to double side polishing using a double side polishing apparatus, and SOI wafer was produced using the base wafer by the same method as Example 1. The resultant wafer had thickness of about 100 nm and a standard deviation ($\sigma$) of SOI layer thickness distribution was about 2.0 nm.

EXAMPLE 4

The shape of the back surface of the base wafer of the SOI wafer produced in Example 1 was measured using AutoSort 200 (manufactured by Tropel Corporation, a brand name). Power spectrum density (PSD) was determined by conducting analysis of frequency according to the following manner. The results of the analysis was shown in FIG. 7.

Figure 7:
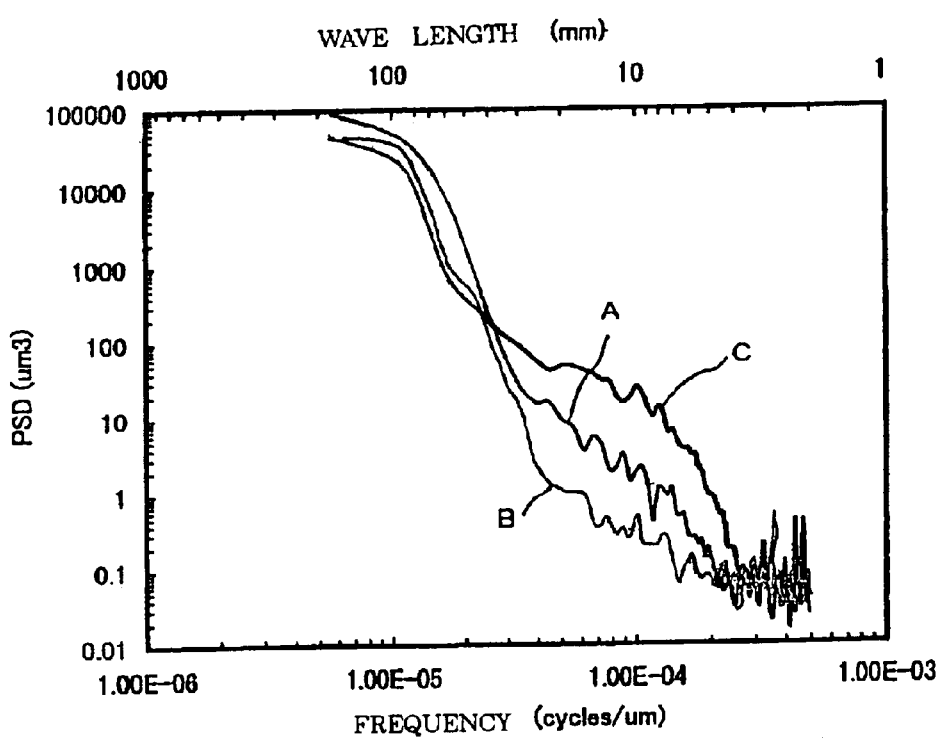
FIG. 7 is a view showing results of measurement of power spectrum density by analyzing a frequency of waviness on the back surface of the base wafer (Example 4).

In FIG. 7, Curved line A shows a result as for the SOI wafer of Example 1, Curved lines B, C show a result as for a back surface of the wafer of Comparative Example 1 subjected to only alkali etching (CW) and a result as for a back surface of the wafer subjected to only acid etching using a mixed acid consisting of hydrofluoric acid and a nitric acid with 30 $\mu$m instead of alkali etching of Comparative Example 1.

As shown in FIG. 7, when comparing power spectrum density of waviness component of wavelength 10 mm on the back surface of the wafer, alkali etching+acid etching of the present invention (FIG. 7A), only alkali etching (FIG. 7B) and only acid etching (FIG. 7C) are clearly different. Furthermore, specific power spectrum density of A, B, C in waviness component having a wavelength 10 mm were about 2 $\mu$m$^3$, 0.4 $\mu$m$^3$, 20 $\mu$m$^3$ respectively.

Accordingly, if power spectrum density in the waviness components having wavelength of 10 mm is 0.5 to 10 $\mu$m$^3$ as A, the condition of the surface is surely intermediate between those obtained by alkali etching and by acid etching.

Analysis of frequency in the present example was conducted as follows. First, about 2000 points in the surface of the wafer was measured with AutoSort200 (described above) for measuring a distance from a detector to the back surface of the wafer without contact, and then the measured data was input to a computer, and frequency analysis was conducted, which comprises filter treatment, followed by Fourier transformation to obtain amplitude and calculation of power spectrum density.

The filter treatment is conducted in order to take basic periodical component that will be necessary for Fourier transformation, there are conducted treatment for finding a center line and treatment for taking out an interval containing data according to Window function.

Fourier transformation is that all periodical functions can be represented by sum of trigonometric functions. Namely, profile is divided into sin and cos, and frequency (spatial frequency in the present invention) and strength (amplitude) of sin and cos are obtained by the following formula (1).

$$F(k)=\Sigma X_i \exp(-j2\pi k_i/N)$$

$$(i=1,\ldots N,\ k=0,1,\ldots N-1) \tag{1}$$

F(k) is amplitude at wave number k. $X_i$ is measured data, i is number of data j represents imaginary number. Real number item and imaginary number item in Fourier transformation represent amplitude of sin component and amplitude of cos component.

Finally, power spectrum density was calculated. Spatial frequency and roughness strength (amplitude) calculated by Fourier transformation depend on sampling length. Accordingly, if measurement area is different, it is necessary to find vibration energy per unit length in order to compare quantitatively roughness strength (parameter) at specific spatial frequency. The energy per unit length is called as power, power spectrum is plots of a relation between spatial frequency and power. As methods for obtaining power spectrum, there are known square calculation of direct Fourier transformation, Fourier transformation of autocorrelation function, AR method or the like. Among them, square calculation method of direct Fourier transformation was adopted this time. Specifically, using Fourier transformation F (k) of roughness data calculated by the above-mentioned formula (1), power P (k) in spatial frequency k respectively is calculated by the formula (2).

$$P(k)=2\pi d F(k)^2/N \tag{2}$$

d is sampling length by the formula (2).

The present invention is not limited to the above-described embodiment. The above-described embodiment is a mere example, and those having the substantially same structure as that described in the appended claims and providing the similar action and effects are included in the scope of the present invention.

For example, additives such as surfactants can be added to alkali etching solution and acid etching solution in the above-mentioned embodiments. Specifically, if nitrites such as NaNO$_2$ is added to the alkali etching solution, there can be achieved an effect of making pits shallow. If surfactants such as fluoro or nonion surfactant is added, an effect of reducing stain can be obtained.

As acid etching solution, although an aqueous solution of mixed acid comprising hydrofluoric acid, nitric acid, acetic acid and water was exemplified, an aqueous solution of mixed acids comprising hydrofluoric acid, nitric acid and water, excluding acetic acid can be used to achieve the similar effect to those of the present invention.

What is claimed is:

1. A method of producing a bonded wafer comprising bonding a bond wafer made of silicon single crystal and a base wafer via an oxide film or directly and then reducing thickness of the bond wafer, wherein the base wafer is a wafer produced by processes comprising slicing a silicon single crystal ingot, and then subjected at least to chamfering, lapping, etching, mirror polishing and cleaning, and the etching process is conducted by subjecting the wafer to alkali etching, and then acid etching, and an etching amount in the alkali etching is larger than an etching amount in the acid etching.

2. The method of producing a bonded wafer according to claim 1 wherein a chamfered part of the base wafer is subjected to a mirror finishing process after the etching process.

3. The method of producing a bonded wafer according to claim 1 wherein a chamfered part of the base wafer is subjected to a mirror finishing process after bonding the bond wafer to the base wafer.

4. The method of producing a bonded wafer according to claim 1 wherein an etching process is performed by dipping the wafer in an aqueous solution of hydrogen peroxide after conducting alkali etching, and then conducting acid etching.

5. The method of producing a bonded wafer according to claim 1 wherein the etching amount is 10 to 30 $\mu$m in the alkali etching and 5 to 20 $\mu$m in the acid etching.

6. The method of producing a bonded wafer according to claim 1 wherein the alkali etching solution is an aqueous solution of NaOH or an aqueous solution of KOH, and the acid etching solution is an aqueous solution of mixed acids comprising hydrofluoric acid, nitric acid, acetic acid and water.

7. The method of producing a bonded wafer according to claim 5 wherein the alkali etching solution is an aqueous solution of NaOH or an aqueous solution of KOH, and the acid etching solution is an aqueous solution of mixed acids comprising hydrofluoric acid, nitric acid, acetic acid and water.

8. The method of producing a bonded wafer according to claim 1 wherein the acid etching is reaction-controlled acid etching.

9. The method of producing a bonded wafer according to claim 8 wherein the solution for reaction-controlled acid etching is an aqueous solution of mixed acids comprising hydrofluoric acid, nitric acid, acetic acid and water in which silicon is dissolved at concentration of 20 to 30 g/l.

10. A method of producing a bonded wafer comprising bonding a bond wafer made of silicon single crystal and a base wafer via an oxide film or directly, and then reducing thickness of the bond wafer, wherein the base wafer is a wafer produced by processes comprising slicing a silicon single crystal ingot, and then subjected at least to chamfering, lapping, etching, mirror polishing and cleaning, and the etching process is conducted by subjecting the wafer to acid etching, and the mirror polishing process is conducted on both surfaces.

11. The method of producing a bonded wafer according to claim 10 wherein a chamfered part of the base wafer is subjected to a mirror finishing process after the above-mentioned etching process.

12. The method of producing a bonded wafer according to claim 10 wherein a chamfered part of the base wafer is subjected to a mirror finishing process after bonding a bond wafer to a base wafer.

13. A bonded wafer produced by a method according to claim 1.

14. A bonded wafer produced by a method according to claim 10.

15. A bonded wafer produced by a method according to claim 9, wherein a back surface of its base wafer is chemically etched and a chamfered part is mirror surface, and on the chemically etched back surface, the maximal depth of the pit is 6 $\mu$m or less and the average value of waviness is 0.04 $\mu$m or less.

16. A bonded wafer produced by a method according to claim 1, wherein a power spectrum density on a back surface of its base wafer is 0.5 to 10 $\mu m^3$ as measured by waviness having a wavelength of 10 mm.

17. A bonded wafer produced by a method according to claim 2.

18. A bonded wafer produced by a method according to claim 3.

19. A bonded wafer produced by a method according to claim 9.

20. A bonded wafer produced by a method according to claim 11.

21. A bonded wafer produced by a method according to claim 12.

* * * * *